United States Patent [19]

Bristoll

[11] Patent Number: 4,937,708

[45] Date of Patent: Jun. 26, 1990

[54] COMPUTER ASSEMBLY

[75] Inventor: Truman K. Bristoll, Red Hook, N.Y.

[73] Assignee: International Business Machines Corporation, Armonk, N.Y.

[21] Appl. No.: 405,611

[22] Filed: Sep. 11, 1989

[51] Int. Cl.⁵ .............................................. H02B 1/02
[52] U.S. Cl. .................................... 361/429; 361/415; 361/428
[58] Field of Search ........................... 211/41; 248/121; 361/383–385, 391, 412–415, 428–429; 364/708; 439/64, 631

[56] References Cited

U.S. PATENT DOCUMENTS

| | | | |
|---|---|---|---|
| 3,198,991 | 8/1965 | Barnett | 361/384 |
| 3,443,161 | 5/1969 | King | 317/101 |
| 3,508,117 | 4/1970 | Cuzner | 317/100 |
| 3,833,840 | 9/1974 | Sinden | 317/101 |

OTHER PUBLICATIONS

IBM Technical Disclosure Bulletin, vol. 8, No. 11, Apr. 1966, p. 1693, Close et al.

Primary Examiner—Gregory D. Thompson
Attorney, Agent, or Firm—Robert L. Troike

[57] ABSTRACT

A multi-board computer assembly is provided that permits shorter length cables in critical paths between boards by mounting the boards in frames that extend diagonally form the center with the critical path boards closest to the center and the other boards extending in step-like fashion away from the center of the assembly.

2 Claims, 3 Drawing Sheets

COMPUTER ASSEMBLY

This invention relates to a computer assembly of multiple circuit boards and more particularly to an assembly which permits shorter length cables between cards or boards in a frame and between cards or boards in one frame to cards or boards in other frames.

BACKGROUND OF THE INVENTION

The speed and the size of computer assemblies is growing at a rapid rate. There is foreseen further increases in the number of parallel processing elements and circuitry and larger and larger computer assemblies requiring faster and faster processing speeds. This is particularly true in supercomputer designs. The circuits are often placed on a circuit board or card and several of these cards are mounted to frames. There are interconnections between cards on a frame and there is frequently a need to make interconnection by cables between the cards or boards on one frame to cards or boards on other frames. The distances involved however with such high speed circuitry can themselves cause significant delay and it is highly desirable to find a manner in which the circuit boards can be closely packed and the interconnection lengths minimized. It is further desirable that these lengths be equalized to prevent skewing errors.

In a typical prior art circuit assembly, circuit modules such as IBM (International Business Machines Corporation) TCMs (Temperature Control Modules) are solder connected to rectangular printed circuit cards. The input/output connections to the circuitry of each card are brought out to printed circuit lines at the edge of the card. A large number of the cards are inserted into electrical connectors on a large printed circuit board sometimes referred to as a "motherboard". In a typical prior art circuit assembly the circuit elements are mounted on the printed cards which are themselves mounted on a larger printed circuit board which provides electrical interconnection between the circuit cards.

Conventional packaging techniques place the component mounting boards parallel to the long axis of the frame as shown in FIG. 1. The boards are packaged within the frame using this concept are separated by one another by the width of the frame. Therefore communication between these boards is increased by the width of the center frame as shown in FIG. 1.

Summary of the Invention

According to one aspect of the present invention a multiboard computer assembly is provided that permits shorter length cables interconnecting the boards wherein the boards are placed in frames and sub-assemblies and in a parallel step-like arrangement away from a center region where other sub-assemblies or frames extend. The sub-assemblies or frames extend diagonally from the assembly center with the boards of one sub-assembly or frame parallel to the boards of the other sub-assembly or frames. The boards have their connectors at the end closest to the other boards and facing generally toward the center of the assembly. The cables interconnect the boards at these connectors.

Brief Description of the Drawings

The invention will now be described with reference to the accompanying drawings in which.

Description of the Preferred Embodiment

Figure 1:
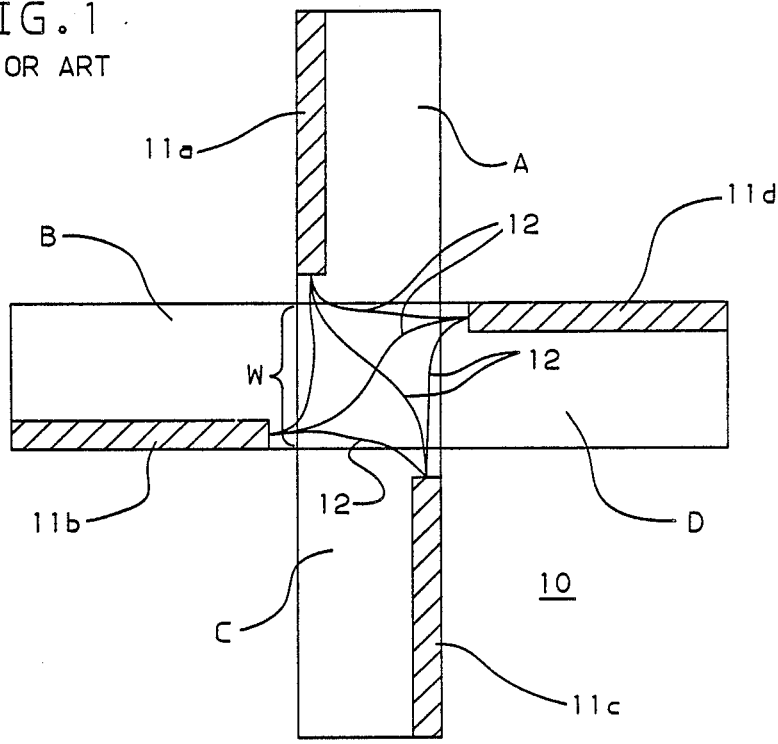
FIG. 1 is a top plan view of an assembly according to the prior art techniques.

Referring to FIG. 1 there is illustrated a prior art assembly 10 according to conventional packaging technique for mounting boards and interconnecting frames. As shown, the boards 11a–11d are packaged within the frames A, B, C and D with the long axis of the boards parallel to the long axis of the corresponding frame. The frames A, B, C, and D are joined to form a cross with a center section 14 of width W to allow for interconnecting the component boards 11a–11b connectors for the boards 11a–11b are at the end nearest to the center of the frame assembly. There are cables 12 that interconnect from frame to frame at the connectors such as from frame A to frame C or frame B to frame D. These cables must transverse the width of the center section. Therefore the communication length or delay between these boards is increased by at least the width W of the center section which is equal to the width of the frame at a minimum.

Figure 2:
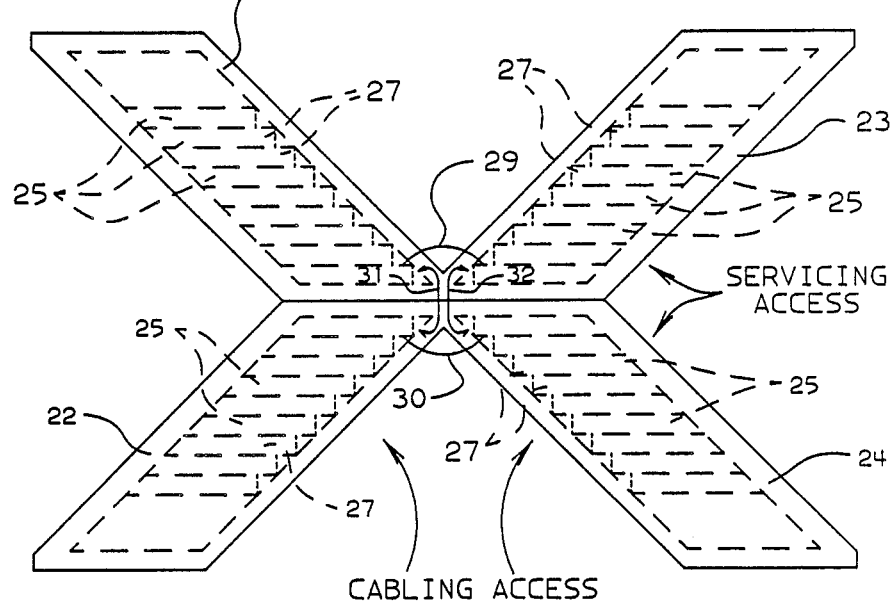
FIG. 2 is a top plan view of the multi-frame assembly in an embodiment of the present invention.

Referring to FIG. 2 there is illustrated a top plan view of a multi-frame computer system 20 according to one embodiment of the present invention. Referring to FIG. 2 the four frames 21, 22, 23 and 24 are each oblique parallelogram shaped and each of the frames includes a plurality of parallel staggered offset support boards or cards 25. The boards or cards 25 may each hold several IBM TCMs (temperature control modules) with its own power supply. The boards or cards 25 extend in step-like fashion away from the center of the assembly where the corners of the frames 21–24 are joined. The frames 21–24 and the support boards 25 extend in diagonal directions from the center. The cabling connectors 27 are located at the end of the boards nearest the center of the assembly 20. The connectors 27 extend facing one another from frame 21 to frame 23 or from frame 22 to frame 24. The cables between frames 21 and 23, such as cable 29, is across the V-shaped cable access gap between these frames. Likewise the cabling between frames 22 and 24 is across the gap between these frames as shown by cable 30. The cabling between boards 25 on frames 21 and 22 and 23 and 24 is in the center region represented by arrows 31 and 32. The boards 25 having the critical connection paths are located closest to the center of the system 20 where the frames are joined so that they may be interconnected via the shortest length cables. The board end opposite the connector end can be open or allow opening for servicing access. Cabling access is done in the inboard end or the end closest to the center.

Figure 3:
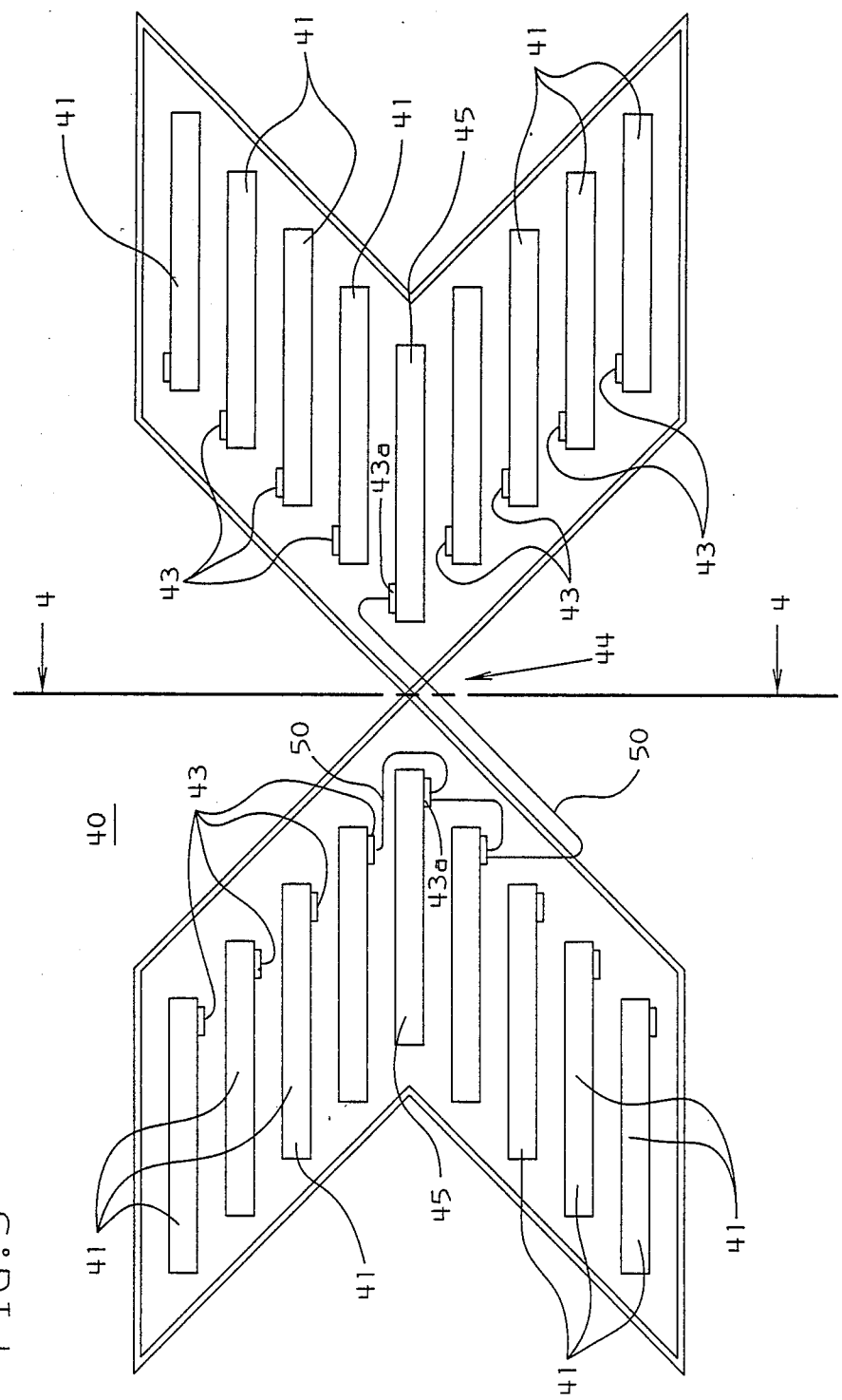
FIG. 3 is a top plan view of the assembly with the top of the frame removed according to another embodiment of the present invention.

Referring to the sketch of FIG. 3 there is illustrated the principles of the present invention in connection with another embodiment. The boards 41 are shown with the top cover of the computer frame system 40. The boards 41 are parallel to each other and have their connectors 43 at the end 41a nearest the center 44 of the system 40. The aligned boards 45 are closest to the center and the other boards 41 in each frame are progressively staggered in parallel relation so the boards 41 form a step-like pattern away from the center 44 with the connectors 43a of the closer in-board board (closer to the center) not overlapped by the adjacent board. This permits a shorter length line from board to board in the same frame and closer placement of the boards. Further since the critical boards have to be interconnected with other boards in other frames are located near the center of the close spacing permits shorter length cables as represented by cables 50.

Figure 4:
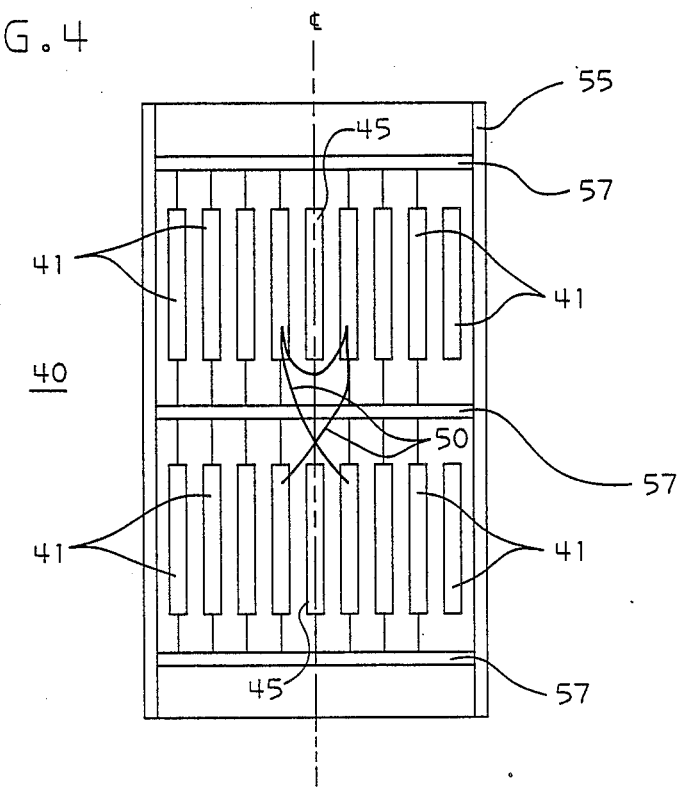
FIG. 4 is an elevational view of FIG. 3 taken along lines 4—4 in FIG. 3.
Figure 5:
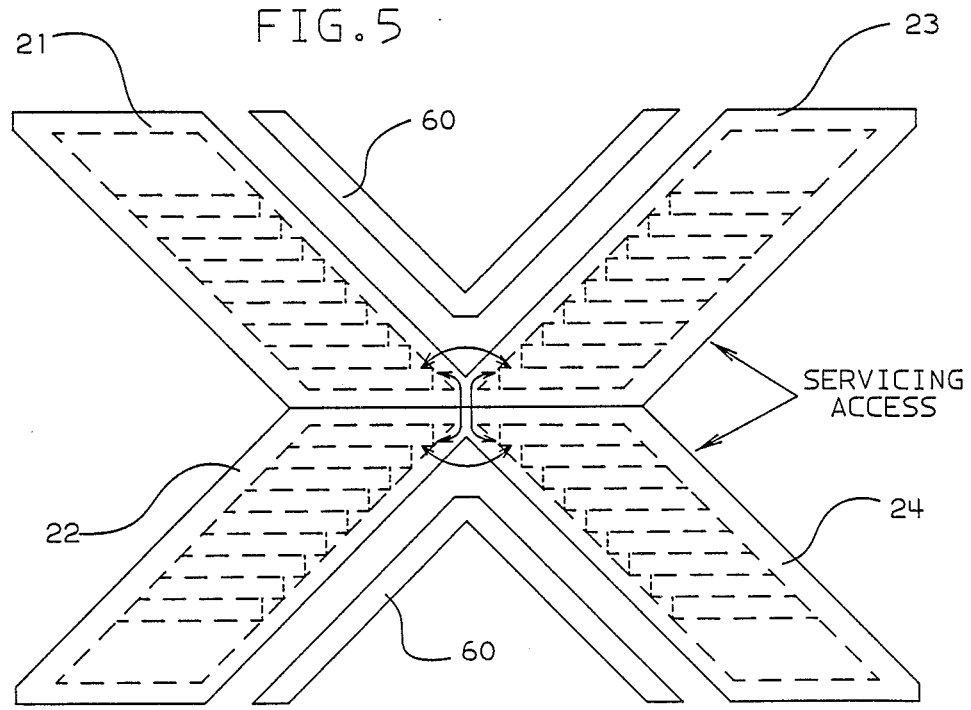
FIG. 5 is a top plan view of the assembly of FIG. 2 with cable organizer frames.

Referring to FIG. 4 there is an elevation view of the boards of FIG. 3 as seen in the 4—4 direction. The boards 41 appear as both slidably mounted to shelves 57 of a bookcase like frame 55 with cables 50 interconnecting the boards. There may be a plurality of shelves. The connectors could be flush with the end surface for easy connection. The boards may, for example, be support boards with PC boards, TCMs with its own supply thereon connected by bus lines and panels of connectors mounted across the end of the board and coupled to the board present connectors facing each other and the center of the assembly. An example of this type of assembly is disclosed in co-pending application Ser. No. 404,807, filed Sept. 8, 1989, of Casa et al. entitled "High Density Circuit Assembly". In this case the boards and the frames would be in the configuration shown that extend out in step-like fashion from the center. Further the cabling can be accomplished by two cable frames 60 and 60a as disclosed in application Ser. No. 405,614, filed Sept. 8, 1989, of Casa et al. entitled "Cable Organizer". In this case the cable organizer would be in the two V-shaped frames to interconnect frames 21 and 23 and frames 22 and 24 in FIG. 2 as illustrated in FIG. 5.

I claim:

1. A multi-frame computer assembly comprising:
    a plurality of frames joined near their corners to each other, each frame including a plurality of parallel staggered offset circuit boards or cards, said boards extending in step-like fashion away from the center where the corners of the frames are joined;
    said frames further arranged such that the boards in the frames are parallel to or coplanar with the boards in the other frames;
    said boards further having their connections at an end nearest said center of the assembly; and
    cables interconnecting said boards at said connections.

2. The assembly of claim 1 wherein the boards located closest to the center are the critic boards where connectors from one frame are interconnected with connectors in a different frame.

* * * * *

UNITED STATES PATENT AND TRADEMARK OFFICE
CERTIFICATE OF CORRECTION

PATENT NO. : 4,937,708
DATED : June 26, 1990
INVENTOR(S) : T. K. Bristoll

It is certified that error appears in the above—identified patent and that said Letters Patent is hereby corrected as shown below:

Column 4, line 24      Change "critic" to ---critical path---

Signed and Sealed this

Tenth Day of December, 1991

*Attest:*

HARRY F. MANBECK, JR.

*Attesting Officer*  *Commissioner of Patents and Trademarks*